US010157912B2

(12) United States Patent
Basker et al.

(10) Patent No.: US 10,157,912 B2
(45) Date of Patent: *Dec. 18, 2018

(54) CMOS COMPATIBLE FUSE OR RESISTOR USING SELF-ALIGNED CONTACTS

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Singerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/665,897

(22) Filed: Aug. 1, 2017

(65) Prior Publication Data
US 2017/0330875 A1 Nov. 16, 2017

Related U.S. Application Data

(60) Continuation of application No. 15/176,258, filed on Jun. 8, 2016, now Pat. No. 9,876,009, which is a
(Continued)

(51) Int. Cl.
H01L 27/11 (2006.01)
H01L 27/06 (2006.01)
(Continued)

(52) U.S. Cl.
CPC .... *H01L 27/0629* (2013.01); *H01L 21/76897* (2013.01); *H01L 21/8234* (2013.01); *H01L 21/823475* (2013.01); *H01L 23/5228* (2013.01); *H01L 23/5256* (2013.01); *H01L 23/5283* (2013.01); *H01L 27/0617* (2013.01); *H01L 28/20* (2013.01); *H01L 29/0649* (2013.01); *H01L 29/41725* (2013.01);
(Continued)

(58) Field of Classification Search
None
See application file for complete search history.

(56) References Cited

U.S. PATENT DOCUMENTS 8,564,023 B2 10/2013 Im et al.
8,710,593 B2 4/2014 Tseng et al.
(Continued)

OTHER PUBLICATIONS

List of IBM Patents or Patent Applications Treated as Related dated Aug. 1, 2017, 2 pages.

*Primary Examiner* — Reema Patel
(74) *Attorney, Agent, or Firm* — Tutunjian & Bitetto, P.C.; Vazken Alexanian

(57) ABSTRACT

A semiconductor device includes dummy gate structures formed on a dielectric layer over a substrate and forming a gap therebetween. A trench silicide structure is formed in the gap on the dielectric layer and extends longitudinally beyond the gap on end portions. The trench silicide structure forms a resistive element. Self-aligned contacts are formed through an interlevel dielectric layer and land on the trench silicide structure beyond the gap on the end portions.

20 Claims, 6 Drawing Sheets

Related U.S. Application Data division of application No. 14/835,381, filed on Aug. 25, 2015, now Pat. No. 9,627,373.

(51) Int. Cl.
*H01L 23/525* (2006.01)
*H01L 49/02* (2006.01)
*H01L 29/66* (2006.01)
*H01L 29/45* (2006.01)
*H01L 21/8234* (2006.01)
*H01L 21/768* (2006.01)
*H01L 23/522* (2006.01)
*H01L 29/06* (2006.01)
*H01L 29/417* (2006.01)
*H01L 23/528* (2006.01)

(52) U.S. Cl.
CPC ............ *H01L 29/45* (2013.01); *H01L 29/456* (2013.01); *H01L 29/66545* (2013.01)

(56) References Cited

U.S. PATENT DOCUMENTS

| | | |
|---|---|---|
| 8,865,542 B2 | 10/2014 | Lim et al. |
| 9,627,373 B2 * | 4/2017 | Basker ................ H01L 27/0617 |
| 9,876,009 B2 * | 1/2018 | Basker ................ H01L 27/0617 |
| 2004/0183157 A1 * | 9/2004 | Wada .................. H01L 27/0629 |
| | | 257/538 |
| 2013/0241031 A1 * | 9/2013 | Li ......................... H01L 27/115 |
| | | 257/529 |
| 2014/0191367 A1 | 7/2014 | Xiao et al. |
| 2014/0319620 A1 | 10/2014 | Hoentschel et al. |
| 2014/0353796 A1 | 12/2014 | Lavoie et al. |
| 2015/0028447 A1 | 1/2015 | Zhang et al. |
| 2015/0097266 A1 * | 4/2015 | Li ...................... H01L 23/5256 |
| | | 257/529 |

* cited by examiner

CMOS COMPATIBLE FUSE OR RESISTOR USING SELF-ALIGNED CONTACTS

BACKGROUND

Technical Field

The present invention relates to resistive elements, and more particularly to devices and methods for forming resistive elements in a same process flow for forming complementary metal oxide semiconductor (CMOS) devices.

Description of the Related Art

On-chip resistors and fuses are employed for a number of different functions for integrated circuit chips, system-on-chip applications and other devices. Resistors are employed in electronic circuits for well-known applications, such as voltage drops, energy dissipation, signal conditioning, etc. Fuses are employed to protect circuits, enable or disable circuit components, etc. Conventional on-chip resistors/fuses require additional processes that add process complexity and costs to the fabrication of the device. In many instances, resistors/fuses take up valuable on-chip real-estate.

SUMMARY

A semiconductor device includes dummy gate structures formed on a dielectric layer over a substrate and forming a gap therebetween. A trench silicide structure is formed in the gap on the dielectric layer and extends longitudinally beyond the gap on end portions. The trench silicide structure forms a resistive element. Self-aligned contacts are formed through an interlevel dielectric layer and land on the trench silicide structure beyond the gap on the end portions.

Another semiconductor device includes first gate structures and second gate structures formed concurrently with the first gate structures formed in an active area and the second gate structures formed on a dielectric layer over a substrate outside the active area. A trench silicide structure is formed between the first gate structures in the active area and between the second gate structures outside the active area. The trench silicide structure in the active area forms a contact to a source/drain region, and the trench silicide structure outside the active area forms a resistive element on the dielectric layer. Self-aligned contacts are formed through an interlevel dielectric layer and land on the trench silicide structure in the active areas to extend the source/drain contact and the self-aligned contacts outside the active area including connections to end portions of the resistive element.

A method for fabricating a resistive element on a semiconductor device includes forming dummy gate structures on a dielectric layer over a substrate with a gap therebetween; forming a trench silicide structure in the gap on the dielectric layer and extending longitudinally beyond the gap on end portions, the trench silicide structure forming a resistive element; and forming self-aligned contacts through an interlevel dielectric layer and landing on the trench silicide structure beyond the gap on the end portions.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
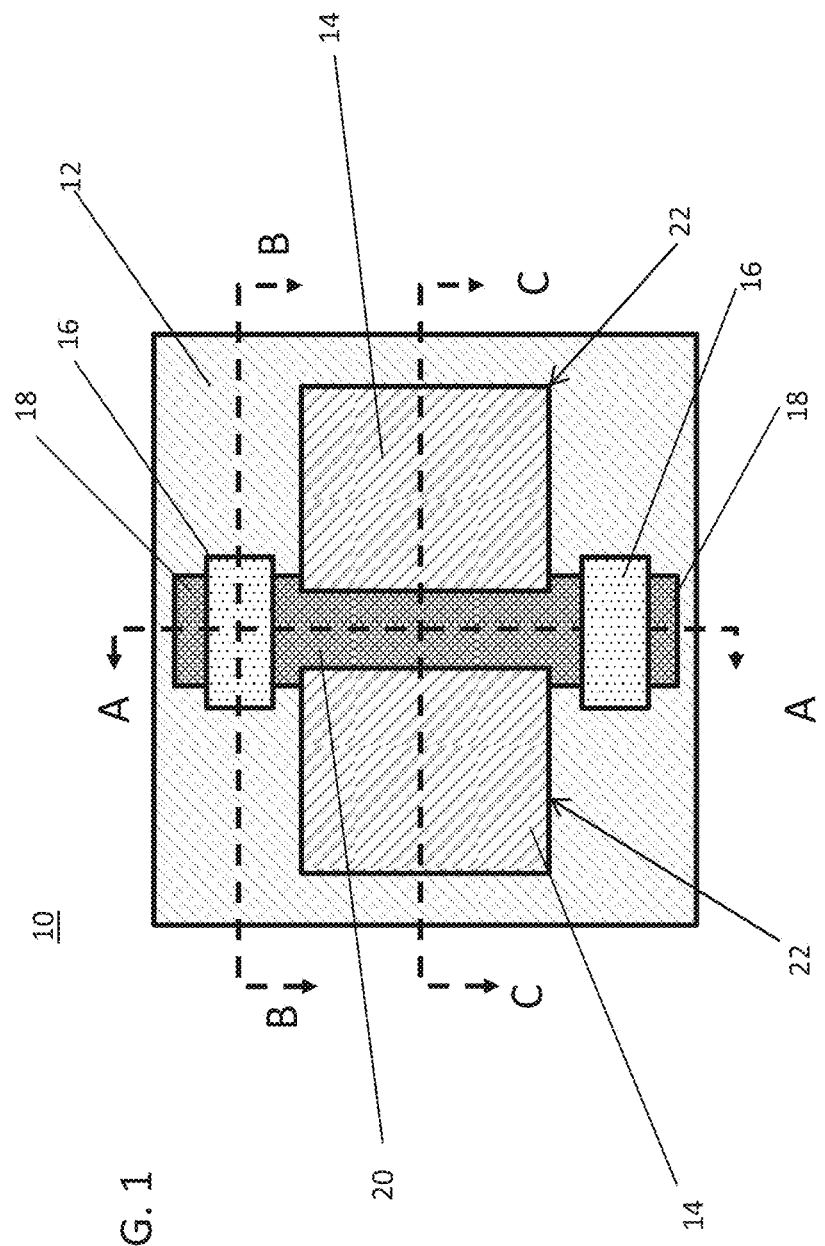
FIG. 1 is a top view showing a region outside of an active area where a trench silicide structure is formed between dummy gate structures to form a resistive element in accordance with the present principles.

In accordance with the present principles, structures and methods for forming on-chip resistors/fuses that are fully compatible with the highly scaled CMOS technologies with self-aligned contacts are provided. A resistor/fuse may be formed by using trench silicide (TS) regions sandwiched between two dummy gates on a shallow trench isolation (STI) region. TS is needed for contacting source/drain regions of active field effect transistors (FETs). By incorporating the formation of the resistor/fuse into current processing, processing time and expense is saved. In addition, the resistor/fuse includes a vertical portion instead of a planar structure as in prior art. This reduces a footprint of the on-chip resistor/fuse. The resistors may include a rupture mode (RM) classification although other resistor types are also contemplated.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., WSi or PtSi. These compounds include different proportions of the elements within the compound, e.g., WSi includes $WSi_x$, where x is any useful number, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a top view of an illustrative semiconductor device 10 is shown having a fuse or resistor structure 20 disposed between two dummy gates 22. The dummy gates 22 are disposed below gate caps 14. The gate caps 14 may be formed from dielectric material, such as, e.g., nitride (SiN). The dummy gates 22 may include fully formed gate structures with metal gate conductors formed therein as will be shown in FIGS. 2-4.

The gate caps 14 have the structure 20 formed therebetween. In one embodiment, the structure 20 is bound by dummy gates 22 and is therefore self-aligned between the dummy gates 22. Structure 20 includes a trench silicide material, e.g., WSi, PtSi, NiSi, etc.

In one embodiment, the trench silicide material of structure 20 may be formed on a semiconductor-on-insulator (SOI) substrate. The structure 20 is self-aligned and deposited between gates 22 that are formed over a buried dielectric layer (e.g., a buried oxide or BOX) of the SOI substrate. In another embodiment, the structure 20 (and dummy gates 22) are formed on a shallow trench isolation (STI) region. The structure 20 and dummy gates are buried in an interlevel dielectric (ILD) layer 12. The ILD 12 may include an oxide.

End portions 18 of the structure 20 provide landing positions for self-aligned contacts 16. End portions 18 of the structure 20 extend beyond dummy gates 22 (which are on top of a shallow trench isolation (STI) region or buried layer (BOX)) so that contacts 16 can be landed on and wrapped around structure 20 to reduce contact-to-TS resistance. The dummy gates 22 are cut so that they include a short segment to permit the structure 20 to extend passed the dummy gates 22. The dummy gates 22 may have their parallel dimension adjusted to adjust the length of the structure 20. It should be understood that layers such as ILD 12 are depicted in FIG. 1 as transparent or removed to render portions of the top view visible for illustration purposes.

The trench silicide of structure 20, the dummy gates 22 and the self-aligned contacts 16 are easily fabricated since these structures are all formed during standard complementary metal oxide semiconductor (CMOS) processing. The TS may be grown using an evaporation process or chemical vapor deposition process with a silicon source and a metal source. The gates 22 and contacts 16 may be formed along with gates and contacts in other areas of the chip or device 10. In a particularly useful embodiment, the structure 20 is formed outside of an active area region and/or outside a region including active gate structures. For example, the structures 20 may be disposed at an end of an array or about a periphery of a region or a periphery of the entire chip.

Figure 2:
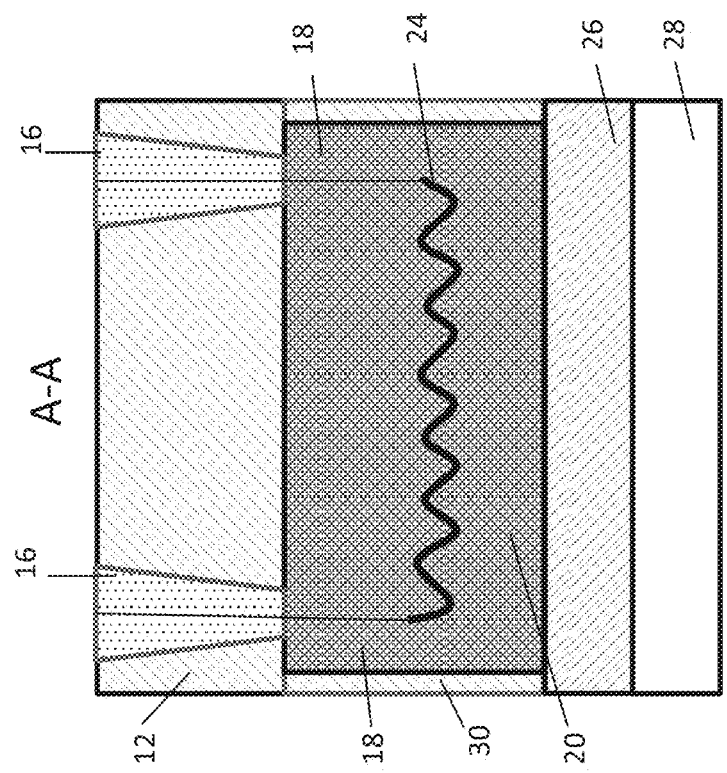
FIG. 2 is a cross-sectional view taken at section line A-A in FIG. 1 showing a longitudinal cut through the trench silicide structure, which is formed between dummy gate structures and indicating electrical connections for the resistive element in accordance with the present principles.

Referring to FIG. 2, a cross-sectional view taken at section line A-A of FIG. 1 is illustratively shown. The contacts 16 are buried in ILD 12, and self-aligned to the structure 20. The contacts 16 may include a metal material, such as W, although other metals or conductors may be employed. The structure 20 is formed in an ILD 30, which may include an oxide material or the like. The structure 20 is formed on a dielectric material 26, which may include an STI region or a buried dielectric (in a SOI substrate). The dielectric material 26 is formed on a substrate 28. The substrate 28 may include Si, Ge, SiGe, GaAs, InP or any other suitable material.

An illustrative resistive element symbol 24 is depicted in FIG. 2 to demonstrate how a resistor or fuse is formed in the structure 20. The symbol 24 shows connections running through the contacts 16, and the resistor or fuse itself runs through a body of the structure 20. The silicide of structure 20 is configured to provide a desired resistance if employed as a resistor. In one embodiment, the resistor element formed by structure 20 includes a rupture mode (RM) type fuse. Other types of resistors or fuses may also be provided. In one instance, structure 20 includes a fuse. The fuse is structured to melt (or rupture) after a threshold current has been achieved through the structure 20. The silicide of structure may melt away from contacts or simply blow to create an open circuit condition. Other scenarios are also contemplated.

Figure 3:
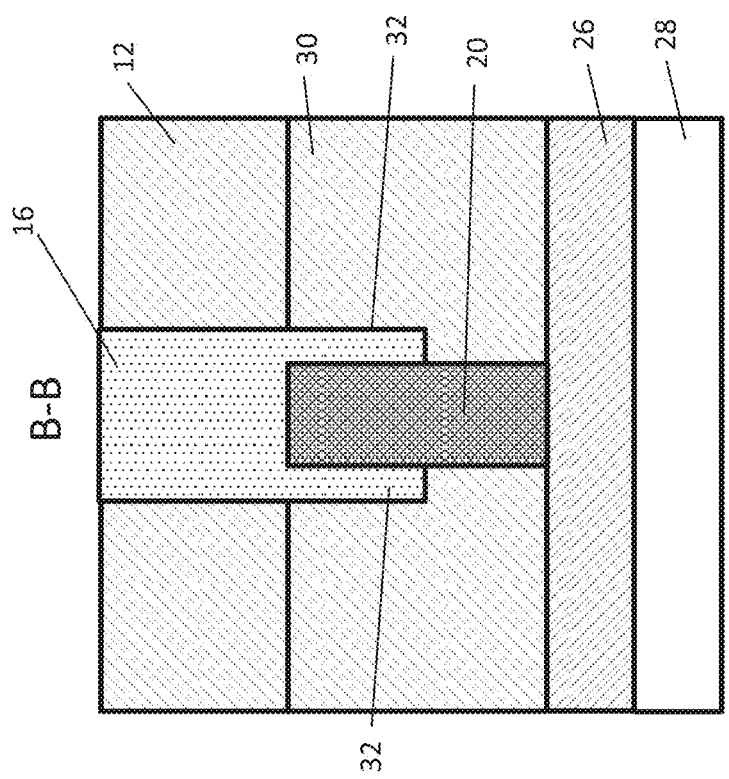
FIG. 3 is a cross-sectional view taken at section line B-B in FIG. 1 showing a cross-section of the trench silicide structure and indicating wrapped-around portions of the contacts over the resistive element in accordance with the present principles.

Referring to FIG. 3, a cross-sectional view taken at section line B-B of FIG. 1 is illustratively shown. Contact holes for the self-aligned contacts 16 are etched larger than a width of the structure 20. In this way, the contacts 16 wrap around the structure 20 to form portions 32. A contact area between the structure 20 and the contacts 16 is increased to reduce contact resistance therebetween. When structure 20 forms a resistor, the value of the resistor will be more dependent on the resistance of the material of the structure 20 than on the contact resistance between the structure 20 and the contacts 16.

Figure 4:
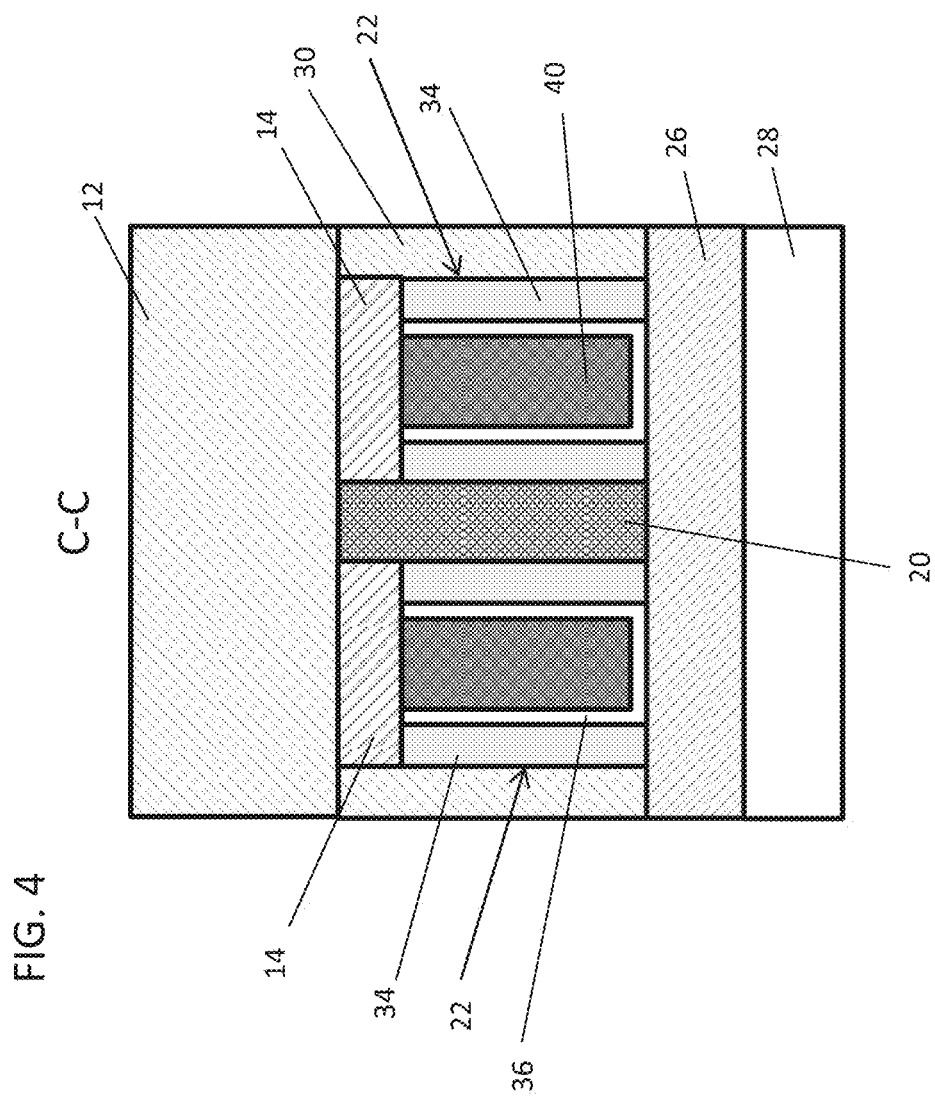
FIG. 4 is a cross-sectional view taken at section line C-C in FIG. 1 showing a cross-section of the dummy gate structures in accordance with the present principles.

Referring to FIG. 4, a cross-sectional view taken at section line C-C of FIG. 1 is illustratively shown. FIG. 4 shows the structure 20 disposed between dummy gate structures 22. The resistor/fuse is formed by using the structure 20 (trench silicide) sandwiched between the two dummy gates 22 on the dielectric layer 26, which may include an STI region or a buried dielectric region. The dummy gate structures 22 may include a gate dielectric layer 36 formed in contact with the dielectric layer 26. The gate dielectric layer 36 may include a high-k dielectric material, such as $HfO_2$ or the like.

The dummy gate structures 22 may include one or more gate conductor materials 40 formed on the gate dielectric layer 36. The gate conductor materials 40 may include, e.g., a gate conductor including a metal such as W, and a work function metal (WFM), which may include Au or Pt. Other gate conductive materials may be employed. The dummy gate structures 22 may include sidewall spacers 34 and gate caps 14. Spacers 34 and gate caps 14 include dielectric materials and may include silicon nitride or the like.

It should be noted that the materials and processes employed in forming the structure 20, the dummy gate structures 22, etc. are compatible with and inserted in a CMOS workflow to eliminate special processing that may occur in conventional devices.

In accordance with useful embodiments, the structure 20 includes a vertical orientation between the dummy gate structures 22 (e.g., instead of a planar structure in the prior art). This advantageously reduces a footprint of the on-chip structure 20 (e.g., resistors/fuses).

Figure 5:
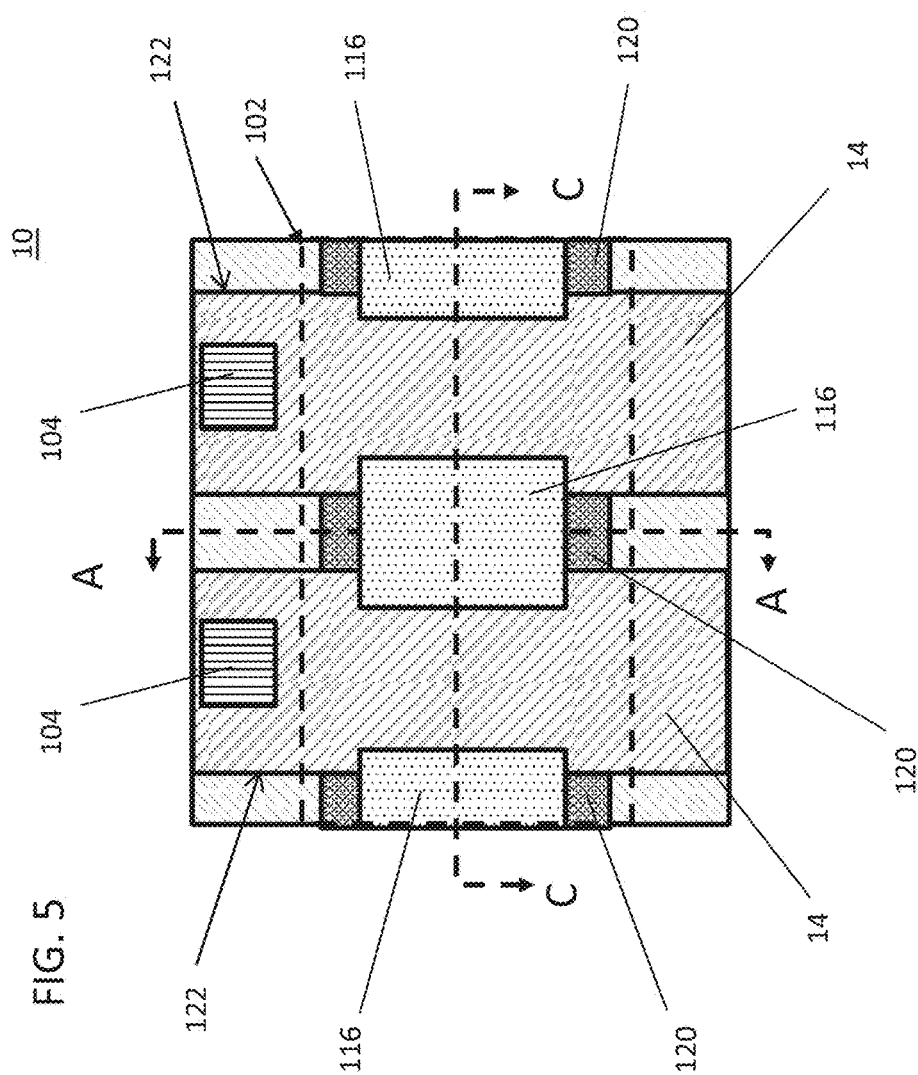
FIG. 5 is a top view showing an active area region where a trench silicide structure is formed between active gate structures to form a S/D contact in accordance with the present principles.

Referring to FIG. 5, a top view of the illustrative semiconductor device 10 is shown in a region where a metal oxide semiconductor field effect transistor (MOSFET) is formed in an active area 102. A trench silicide (TS) structure 120 is disposed between two active gates 122. The gate caps 14 have the structure 120 formed therebetween at a same time as the structure 20 is formed between dummy gate 22 (FIG. 4).

The active gates 122 are disposed below gate caps 14. The gate caps 14 may be formed from a nitride material, e.g., SiN. The active gates 122 include fully formed gate structures with gate conductor 40, gate dielectric 36 and spacers 34 formed therein (FIG. 4). In one embodiment, the structure 120 is bound by the active gates 122 and is therefore self-aligned between the active gates 122. Structure 120 includes a trench silicide material, e.g., WSi, PtSi, NiSi, etc. The trench silicide is deposited between the gates by a selective patterning process. The silicided regions for structure 20 and 120 are formed concurrently using a same process.

Gate contacts 104 are formed through material of the gate caps 14 to create a connection to gates 122. Self-aligned contacts 116 are also formed to land on the structure 120. The contacts 116 have a different size than contacts 16, and only one contact connects to each structure 120.

Figure 6:
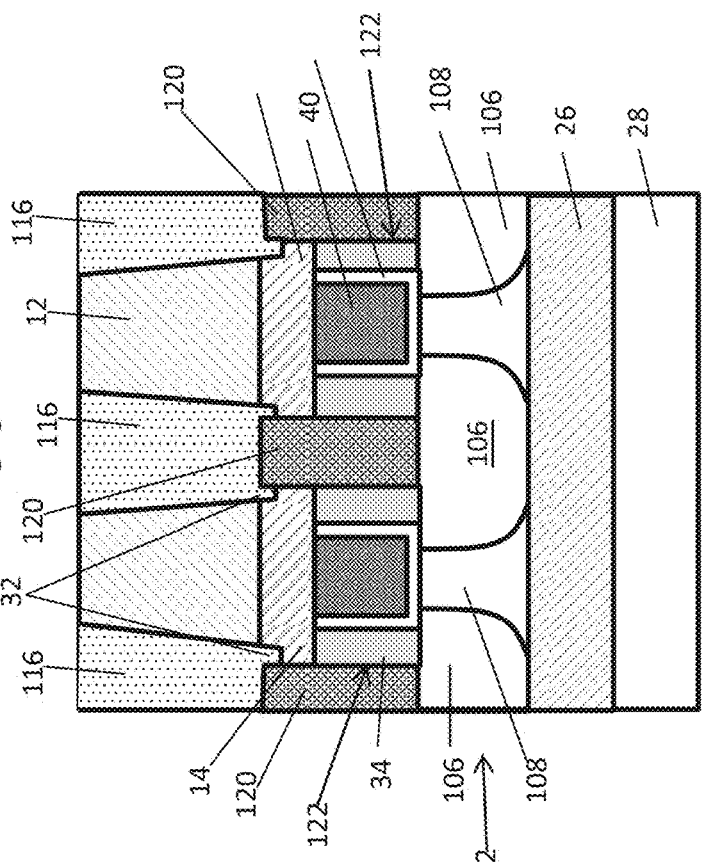
FIG. 6 is a cross-sectional view taken at section line A-A in FIG. 5 showing a longitudinal cut through the trench silicide structure in accordance with the present principles.

Referring to FIG. 6, a cross-sectional view taken at section line A-A of FIG. 5 is illustratively shown. The contacts 116 are buried in ILD 12, and self-aligned to the structure 120. The contacts 116 may include a metal material, such as W, although other metals or conductors may be employed. The structures 120 are formed in an ILD 30, which may include an oxide material or the like. The structure 120 is formed on a source/drain region 106 in the active area 102. The S/D region 106 is formed on the dielectric material 26, which may include an STI region or a buried dielectric (in a SOI substrate). The dielectric material 26 is formed on the substrate 28.

In one embodiment, the trench silicide material of structure 120 may be formed on a semiconductor-on-insulator (SOI) substrate. The structure 120 is self-aligned and deposited between gates 122 that are formed over a buried dielectric layer (e.g., a buried oxide or BOX (layer 26)) of the SOI substrate. In another embodiment, the structure 120 (and active gates 122) is formed on a shallow trench isolation (STI) region (layer 26).

Figure 7:
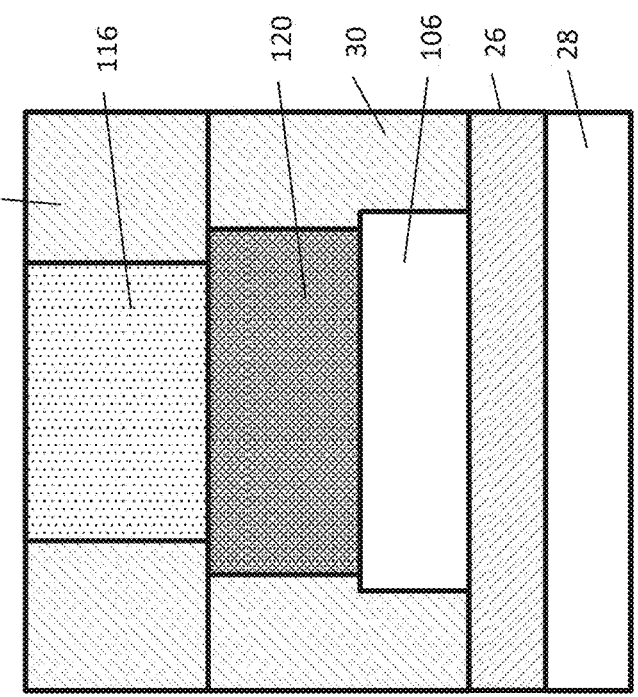
FIG. 7 is a cross-sectional view taken at section line C-C in FIG. 5 showing a cross-section of the active gate structures in accordance with the present principles.

Referring to FIG. 7, a cross-sectional view taken at section line C-C of FIG. 5 is illustratively shown. The active gate structures 122 include a gate dielectric layer 36 formed in contact with a fin 108. The fins 108 provide a transistor channel therein. The gate structures 122 may include one or more gate conductor materials 40 formed on the gate dielectric layer 36. The gate conductor materials 40 may include, e.g., a gate conductor including a metal such as W, and a work function metal (WFM), which may include Au or Pt. Other gate conductive materials may be employed. The gate structures 122 include sidewall spacers 34 and gate caps 14. Spacers 34 and gate caps 14 include dielectric materials and may include silicon nitride or the like.

The structures 120 provide landing positions for self-aligned contacts 116. The contacts 116 can be landed on and wrapped around (32) structure 120 to reduce contact-to-TS resistance. The trench silicide of structure 120, the gates 122 and the self-aligned contacts 116 are fabricated concurrently with corresponding structures in the area depicted in FIG. 1. The gates 122 and contacts 116 may be formed along with gates and contacts in other areas of the chip or device (10).

Contact holes for the self-aligned contacts 116 are etched larger than a width of the structure 120. In this way, the contacts 116 wrap around the structure 120 to form portions 32.

The structure 120 connects to source/drain regions 106 instead of sitting on the dielectric layer (STI or BOX)

directly as in e.g., FIG. 3. The contacts 116 land on top of structure 120, and the structure 120 is bound by active gates 122 versus landing contacts 16 on the ends of structure between dummy gate 22 as in FIGS. 1-4. Active FETs are formed on the active area 102 versus the resistor/fuse being formed on the STI or BOX of dielectric layer 26.

Figure 8:
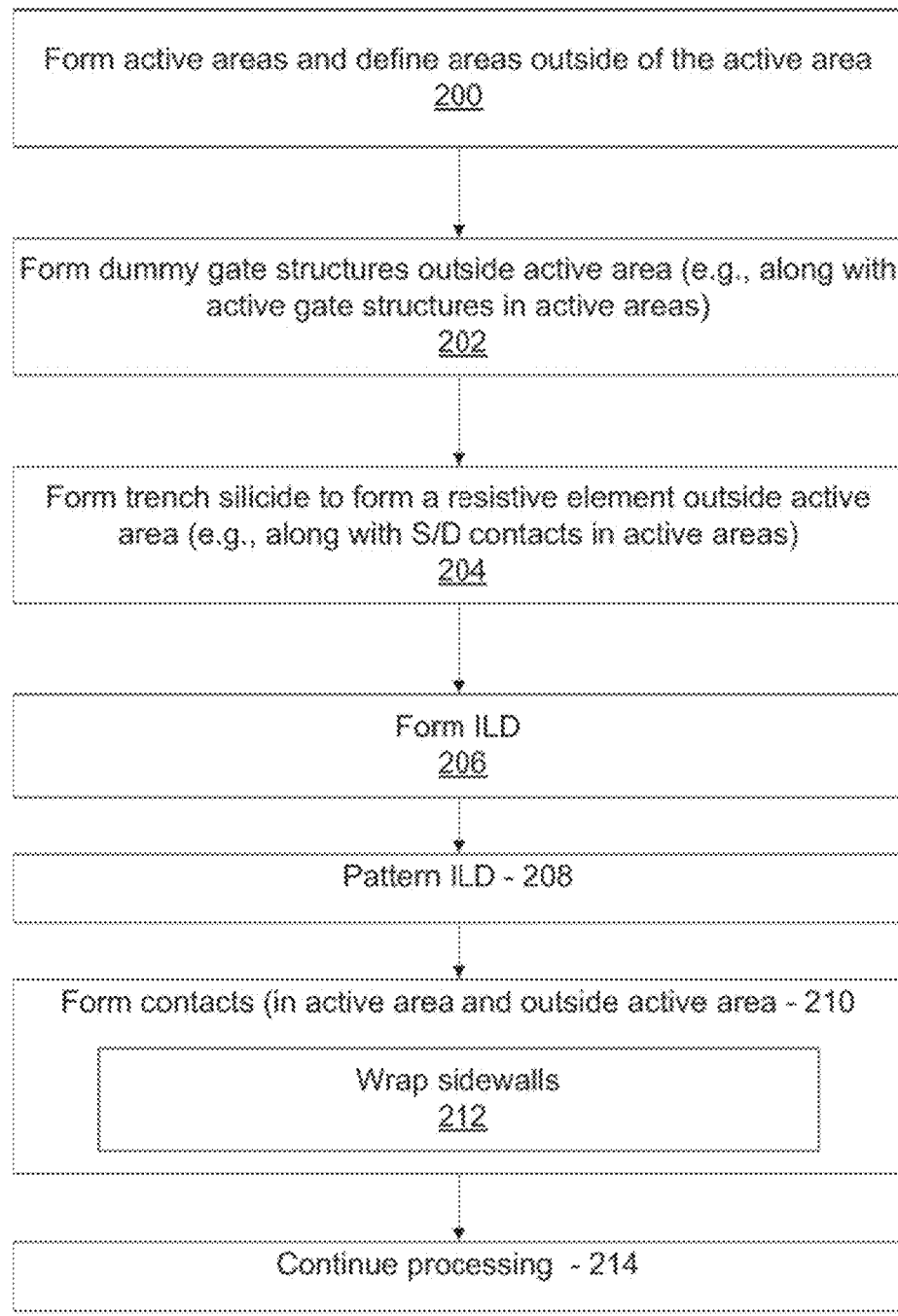
FIG. 8 is a block/flow diagram showing a method for fabricating a resistive element on a semiconductor device in accordance with illustrative embodiments.

Referring to FIG. 8, methods for fabricating a resistive element on a semiconductor device are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 200, a substrate is processed to form active areas and to define areas outside the active areas. The substrate may include a bulk substrate or SOI. Active area processing is performed over S/D regions, and resistive element formation is preferably outside the active area. The processing may include growing/forming S/D regions, etc. for fins or other structures.

In block 202, dummy gate structures are formed on a dielectric layer over a substrate with a gap therebetween. The dummy gate structures are preferably formed outside of an active area. In one embodiment, the dummy structures are formed concurrently with active gate structures in an active area. The dummy gate structures are employed to define the dimension(s) of a resistive element formed in the gap.

In block 204, a trench silicide structure is formed in the gap on the dielectric layer and extends longitudinally beyond the gap on end portions. The trench silicide structure is formed self-aligned to the dummy gate structures. The trench silicide structure forms a resistive element, such as a resistor or fuse, which has its length, height and thickness defined by the adjacent dummy gate structures. The dimensions of the trench silicide structure define its resistance or fuse rating. The trench silicide structure forms S/D contacts in the active area. The resistive element may include a vertical plane disposed transversely with the substrate between the dummy gate structures.

In block 206, an ILD is formed over the dummy gate structures and the trench silicide structures. In block 208, the ILD is patterned to form contact holes. The holes may be oversized to permit wrapping of the self-aligned contacts around a sidewall portion of the trench silicide structure in block 212. In block 210, self-aligned contacts are formed through the ILD (in the contact holes). The contacts land on the trench silicide structure beyond the gap on the end portions. The dummy gate structures, the trench silicide structure and the self-aligned contacts are preferably concurrently formed with corresponding elements in active regions for active field effect transistors (e.g., MOSFETs).

In block 214, processing continues to complete the semiconductor device. This may include forming metallizations, trimming circuits using the fuses, etc.

Having described preferred embodiments for a CMOS compatible fuse or resistor using self-aligned contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   dummy gate structures formed on a first surface of a dielectric layer over a substrate and forming a gap therebetween;
   a trench silicide structure formed in the gap on the first surface of the dielectric layer and extending longitudinally beyond the gap on end portions, the trench silicide structure forming a resistor; and
   self-aligned contacts formed through an interlevel dielectric layer and landing on the trench silicide structure beyond the gap on the end portions.

2. The device as recited in claim 1, wherein the trench silicide structures are concurrently formed in active regions for active field effect transistors as a source/drain contact.

3. The device as recited in claim 2, wherein the self-aligned contacts are concurrently formed in the active regions as a contact to the source/drain contact.

4. The device as recited in claim 1, wherein the dummy gate structures include a gate conductor, a gate dielectric and sidewall spacers as concurrently formed in active regions for active field effect transistors.

5. The device as recited in claim 1, wherein the resistor includes a vertical plane disposed transversely with the substrate between the dummy gate structures.

6. The device as recited in claim 1, wherein the resistor is formed outside of a region including active gate structures.

7. The device as recited in claim 1, wherein the self-aligned contacts wrap-around a sidewall portion of the trench silicide structure.

8. A semiconductor device, comprising:
   first gate structures and second gate structures formed concurrently with the first gate structures formed in an active area and the second gate structures formed on a dielectric layer over a substrate outside the active area;
   a trench silicide structure formed between the first gate structures in the active area and between the second gate structures outside the active area, the trench silicide structure in the active area forming a contact to a source/drain region; and
   self-aligned contacts formed through an interlevel dielectric layer and landing on the trench silicide structure in the active areas to extend the source/drain contact.

9. The device as recited in claim 8, wherein the dielectric layer includes at least one selected from the group consisting of a shallow trench isolation region and a buried dielectric in a silicon on insulator substrate.

10. The device as recited in claim 8, wherein the first and second gate structures include a gate conductor, a gate dielectric and sidewall spacers.

11. The device as recited in claim 8, wherein the self-aligned contacts wrap-around a sidewall portion of the trench silicide structure.

12. The device as recited in claim 8, wherein the second gate structures include one or more gate conductor materials formed on the dielectric layer.

13. A method for fabricating a resistor on a semiconductor device, comprising:
   forming dummy gate structures on a first surface of a dielectric layer over a substrate with a gap therebetween;

forming a trench silicide structure in the gap on the first surface of the dielectric layer and extending longitudinally beyond the gap on end portions, the trench silicide structure forming a resistor; and forming self-aligned contacts through an interlevel dielectric layer and landing on the trench silicide structure beyond the gap on the end portions.

14. The method as recited in claim 13, wherein the dummy gate structures, the trench silicide structure and the self-aligned contacts are concurrently formed with corresponding elements in active regions for active field effect transistors.

15. The method as recited in claim 13, wherein the resistor includes a vertical plane disposed transversely with the substrate between the dummy gate structures.

16. The method as recited in claim 13, wherein the substrate includes silicon on insulator.

17. The method as recited in claim 13, wherein a height of the trench silicide structure is greater than or equal to a height of the dummy gate structures.

18. The method as recited in claim 13, wherein the trench silicide structures are concurrently formed in active regions for active field effect transistors as a source/drain contact.

19. The method as recited in claim 13, wherein the self-aligned contacts are concurrently formed in the active regions as a contact to the source/drain contact.

20. The method as recited in claim 13, wherein the resistor is formed outside of a region including active gate structures.

* * * * *